United States Patent [19]

Jaeger et al.

[11] Patent Number: 4,758,060
[45] Date of Patent: Jul. 19, 1988

[54] INTEGRATED OPTICAL HIGH VOLTAGE SENSOR

[75] Inventors: Nicolas A. F. Jaeger, Richmond; Lawrence Young, Vancouver, both of Canada

[73] Assignee: The University of British Columbia, Vancouver, Canada

[21] Appl. No.: 922,026

[22] Filed: Oct. 22, 1986

[51] Int. Cl.$^4$ ............................................... G02B 6/12
[52] U.S. Cl. ............................... 350/96.11; 350/96.12; 350/96.14
[58] Field of Search ............... 350/96.11, 96.12, 96.13, 350/96.14

[56] References Cited

U.S. PATENT DOCUMENTS 4,300,814 11/1981 Carenco ..................... 350/96.14 X
4,447,116 5/1984 King et al. .................. 350/96.12 X

OTHER PUBLICATIONS

Bassen et al, "An RF Field Strength Measurement System Using an Integrated Optical Linear Modulator", *IEEE MTT-S International Microwave-Symposium Digest*, Washington, D.C., May 28–30, 1980, pp. 317, 318.
Kawaguchi et al, "PLZT Thin-Film Waveguides", *Applied Optics*, vol. 23, No. 13, Jul. 1, 1984, 2187–2191.
Mikami et al, "Modified Balanced-Bridge Switch with Two Straight Waveguides", *Appl. Phys. Lett.* 35(2), Jul. 15, 1979, pp. 145–147.
"Integrated Optical Temperature Sensor", L. M. Johnson et al., *Appl. Phys. Lett.* 41(2), Jul. 15, 1982, pp. 134–136.

*Primary Examiner*—James B. Mullins
*Attorney, Agent, or Firm*—Baker, Maxham & Jester

[57] ABSTRACT

A high voltage sensor using an integrated optical Mach-Zehnder device is disclosed. A capacitive divider for sensing the electric field is connected to an electrode adjacent one of the parallel waveguide sections, while a second electrode adjacent the other section is grounded. The capacitive divider may be fabricated on the same substrate as the Mach-Zehnder device. Two similar devices which can be immersed in the electric field are also disclosed. In one case the device uses a Mach-Zehnder device having waveguides of the slab type. In this variation materials having two different refractive indices, both of which are low relative to the high index slab form the superstrates of the parallel waveguide sections. In the second variation, a Mach-Zehnder device having waveguides of the diffusion type is used. Thin films of high refractive index material are deposited over the two parallel waveguide sections, with the thickness and/or refractive index of the two film sections being different.

4 Claims, 3 Drawing Sheets

INTEGRATED OPTICAL HIGH VOLTAGE SENSOR

BACKGROUND OF THE INVENTION

The invention relates to the field of integrated optics and more particularly to the application of integrated optics to voltage-sensing devices.

Integrated optics is the term used to describe a class of optical devices made using techniques borrowed from the field of integrated electronics. Mono-mode optical waveguides, with extremely small cross-sections, can be made by numerous techniques including diffusion into and thin film deposition onto crystal substrates. Signals can then be transmitted to and from these devices on optical fibres.

The application of integrated optics to temperature sensors is disclosed in a paper of L. M. Johnson, F. J. Leonberger and G. W. Pratt entitled "Integrated Optical Temperature Sensor", Appl, Phys. Lett 41 (2), July 15, 1982. The article discloses the use of a waveguide version of the Mach-Zehnder interferometer in which the input optical waveguide splits into two arms of unequal lengths which then recombine to form an output waveguide. The difference in path length between the two arms is substantially greater than the optical wavelength of the transmitted light. The optical transmission at a given wavelength varies with the effective index of refraction of the arms and path length difference, both of which are in turn temperature-dependent. Hence, changes in the temperature of the device can be detected through variations in the optical transmission.

The application of optical devices to use as high voltage sensors, for example in power transmission lines and substations, is also known. Such devices have been based on the Pockel's and Kerr effects in electro-optic materials. The advantages of optical systems in such applications over conventional voltage transformers are electrical isolation, immunity to electrical noise, the application to potentially large band widths, low cost and small size. Existing sensors, however, are complicated optical sytems employing lenses, polarizers, beam splitters, optical fibre couplers and bulk electro-optic crystals. Such systems are bulkier and more expensive than would be an integrated optical system. Also, the use of large crystals in such bulk devices results in ringing or oscillation which occurs due to the converse piezo-electric and photo-elastic effects.

SUMMARY OF THE INVENTION

The present invention provides an integrated optical device capable of functioning as a high voltage sensor. The present invention adapts a Mach-Zehnder type interferometer to act as a high voltage sensor. The device is adapted so that the propagation constants of the two parallel sections of the device are different functions of the applied electric field or potential. As a result the relative phases of the guided optical fields emanating from each of the parallel sections is different, and the phase difference is measured as a change in the output intensity in the output section of the device. The phase modulation may be obtained by providing a separate capacitive divider in the electric field to be measured. A metal electrode is deposited over one of the parallel waveguide sections in a Mach-Zehnder device and is connected to the capacitive divider. A second parallel metal electrode is deposited over the second parallel waveguide section and is connected to ground. Alternatively the capacitive divider may be connected to an electrode centrally located in the gap between the waveguides, with grounded electrodes on the outside of each waveguide. According to another embodiment of the invention, a large metal plate or capacitive pad is fabricated on the same substrate and connected directly to the first metal electrode on the device. According to another embodiment of the invention, waveguides with shallow diffusion or slab waveguide profiles are used in a Mach-Zehnder device and one of the guides is covered with a medium having a first refractive index and the other with a medium having a second refractive index, or the thickness of the mediums differs as between the two guides.

BRIEF DESCRIPTION OF THE DRAWINGS

In drawings which illustrate embodiments of the invention.

DETAILED DESCRIPTION OF AN EMBODIMENT OF THE INVENTION

Figure 1:
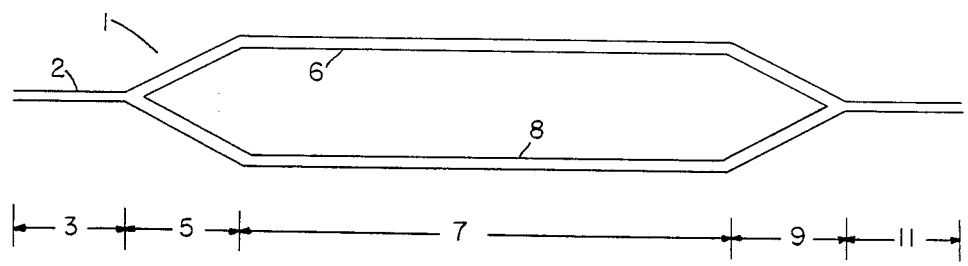
FIG. 1 is a plan view of a prior art Mach-Zehnder device.
Figure 2:
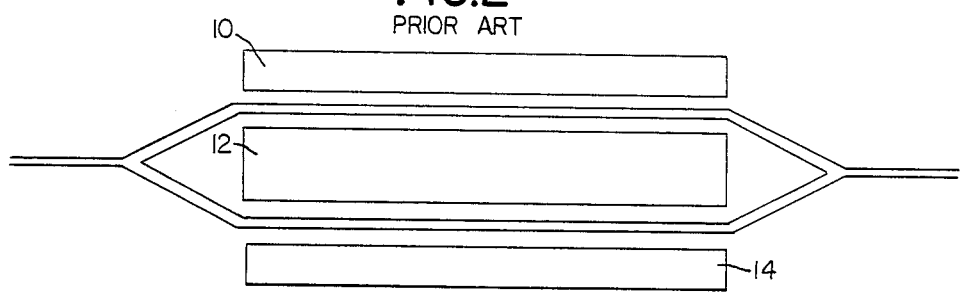
FIG. 2 is a plan view of a prior art Mach-Zehnder device showing the placement of electrodes.

Referring to FIG. 1, a standard Mach-Zehnder device is referred to as 1, consisting of an optical waveguide 2 formed on the surface of an electro-optic substrate by diffusion or thin film deposition. The waveguide has an input section 3, a diverging Y-branch section 5, a section 7 having two separate parallel waveguide sections 6 and 8, a converging Y-branch section 9 and an output section 11. To function as an interferometer, the device is typically provided with an electrode 12 deposited between the two parallel waveguide sections, shown in FIG. 2, and electrodes deposited on the outside of the two parallel waveguides, designated 10 and 14. By applying a different potential difference across the two parallel waveguide sections, a different refractive index is created in the respective parallel sections of the waveguide due to the electro-optic effects of the underlying electro-optic crystal. The result is different propagation constants in the two parallel sections. This results in the phase difference induced in the output section of the waveguide.

The present invention applies the Mach-Zehnder structure to use as a high voltage sensor.

Figure 3:
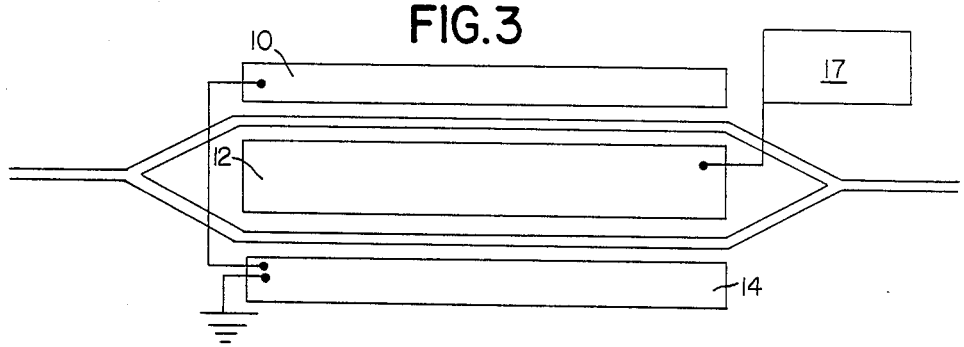
FIG. 3 is a plan view of a voltage sensor of the invention using an external capactive voltage divider.

A first embodiment of the invention as shown in FIG. 3. Using the Mach-Zehnder device of FIG. 2, electrodes 10 and 14 are connected to ground. Electrode 12 is in turn connected to a separate capacitive divider 17. The capacitive divider is immersed in the electrical field to be measured. Such a capacitive divider typically has a conductive plate separated from ground by a dielectric. Hence a potential difference from ground is created in the plate or pad of the capacitive divider which is in turn conducted to electrode 12. When the capacitive divider is immersed in a strong electric field, a large potential difference is created between electrodes 12 and 10, and a potential difference in the opposite direction between electrodes 12 and 14, causing different refractive indexes in the two waveguide sections due to the electro-optic properties of the underlying crystal, and a resultant change in the output signal.

Figure 4:
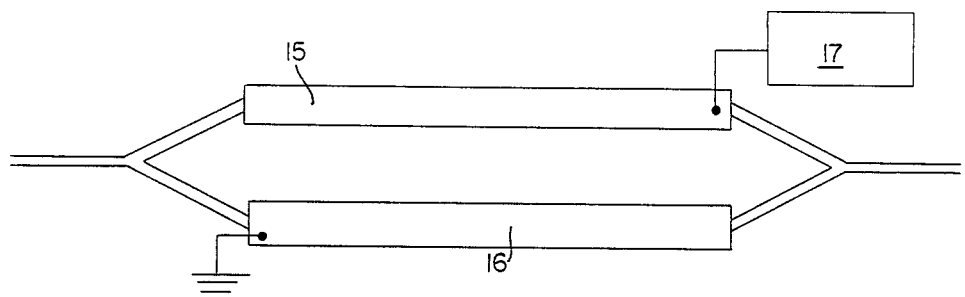
FIG. 4 is a plan view of a further embodiment of the device using an external capacitive, voltage divider.

FIG. 4 shows a variant of the electrode configuration for the device shown in FIG. 3 wherein the Mach-Zehnder device consists of two parallel electrodes 15 and 16 laid across the parallel waveguide sections. One electrode 15 is connected by a conductor to the capacitive divider, while the second electrode 16 is connected to ground. The resultant different electric fields in the region of the two parallel waveguides cause the waveguides to have different propagation constants when the capacitive divider is immersed in a strong field, resulting in a variation in the optical output.

Figure 5:
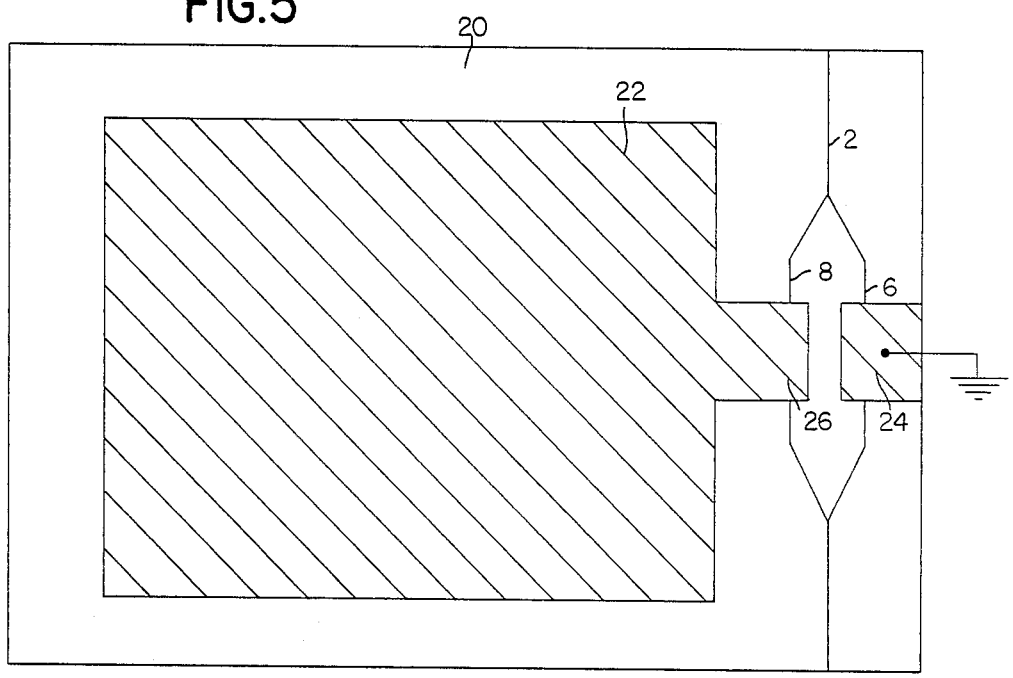
FIG. 5 is a plan view of an embodiment of the invention using an integral capacitive voltage divider.

The foregoing devices may be made a unitary device for immersion in the electrical field in the manner shown in FIG. 5. In this case, the entire Mach-Zehnder device, including electro-optic crystal 20, is mounted on a grounded metal plate. A metal pad 22 having an area which is large relative to electrodes 24 and 26 is mounted on top of the device in conductive relationship with electrode 26. Electrode 24 again is connected to ground. When the device is placed in an electric field, a potential difference will be generated between electrode 26 and ground. Ideally the capacitance from pad to ground should be larger than that across the interelectrode gap. There will be no potential difference between electrode 24 and ground. Accordingly, the potential differences applied across the two sections of waveguides are different, resulting in different propagation constants in the two sections and a measurable change in the transmission in the output section of the device.

Figure 6:
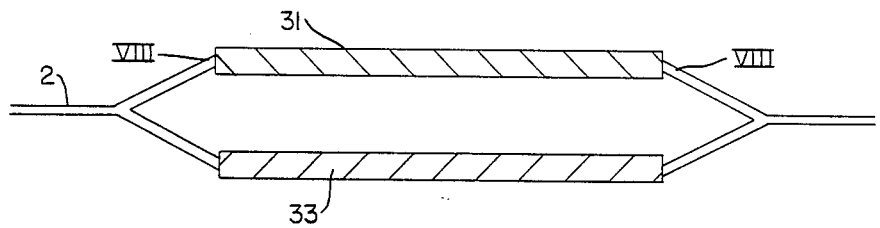
FIG. 6 is a plan view of a slab-type or diffused device of the invention using different loading of the two branches.
Figure 7:
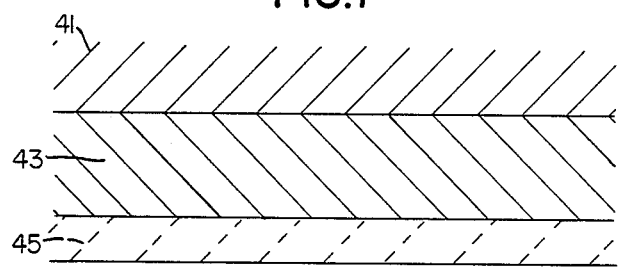
FIG. 7 is a cross-sectional view taken along lines VIII—VIII of FIG. 6 in the case of a slab-type device; and, FIG. 8 is a cross-sectional view taken along lines VIII—VIII of FIG. 6 for the case of a diffused waveguide.
Figure 8:
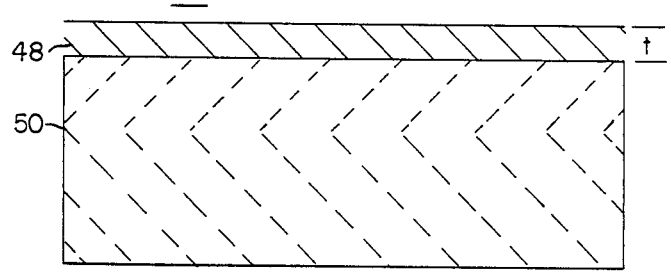

Two further embodiments of the invention are shown in FIGS. 6 through 8. According to these embodiments, the variations in the propagation constants of the two parallel waveguide sections which result from immersion in an electric field are caused by the application of different superstrates 31 and 33 over the two parallel waveguide sections. In the case of a slab-type Mach-Zehnder device, this is achieved by covering one of the branches with a material having a refractive index which is lower than the material it covers but different from the refractive index of the material covering the other branch. In the slab-type waveguide, shown in cross-section in FIG. 7, the waveguide portion is formed by depositing a high refractive index film, such as ZnS designated by 43 onto the electro-optic substrate 45, such as lithium niobate ($LiNbO_3$). On one of the branches 31 the ZnS slab 43 has an air superstrate 41, while on the other waveguide portion a superstrate of a material having a lower refractive index than ZnS, such as tantalum pentoxide ($Ta_2O_5$) is deposited to cover the ZnS. A typical thickness for the layer of ZnS is 200 nanometers. It is found that the propagation constants of the two parallel waveguide sections vary in different ways when immersed in an electrical field due to the different refractive indexes of the superstrates in either case. As a result change is created in the optical output.

A similar approach is taken where the Mach-Zehnder device uses the diffused waveguide. In such a waveguide, the waveguide sections are formed by diffusing appropriately patterned impurities into the electro-optic substrate, for example titanium (Ti) into lithium niobate. In this case films with refractive indexes larger than that of the diffused region are deposited onto the different regions with the extent of the optical fields in the electro-optic portion of the waveguide being controlled by the thickness of the film. Referring to FIG. 8, the diffused region is designated by 50, consisting of Ti diffused into lithium niobate crystal with the Ti content decreasing proportionately from the upper surface of the waveguide downwardly. A thin film of ZnS is deposited onto the upper surface of the waveguide at 48, with the next layer being air 46. A different thickness T is chosen for the layer of ZnS which is deposited over the first waveguide section at 31 from that which is deposited over the second waveguide section at 33. In the preferred form, the thickness of the film on one of the branches is zero, while the thickness of the film on the loaded second branch should be less than 230 nanometers for ZnS.

As will be apparent to persons skilled in the art, various modifications and adaptions of the structures above-described are possible without departure from the spirit of the invention, the scope of which is defined in the appended claims.

We claim:

1. An electro-optic high voltage sensor, comprising a Mach-Zehnder device having first and second parallel waveguide sections for transmission of an input signal, at least two electrodes on the surface of said device lying parallel to, adjacent and associated with respective ones of said parallel waveguide sections, and a capacitive divider conductively connected to one of said electrodes, whereby an applied electromagnetic field induces a potential in said capacitive divider which in turn induces different electric fields in the vicinity of said parallel waveguides sections and a resultant phase difference between the signals transmitted by said first and second waveguide section wherein the capacitance of said capacitive divider with respect to ground is large relative to the capacitance between said electrodes.

2. An electro-optic high voltage sensor as described in claim 1, wherein said capacitive divider comprises a conductive plate mounted on the surface of said Mach-Zehnder device and having an area substantially greater than the area of any one of said electrodes.

3. An electro-optic high voltage sensor, comprising a Mach-Zehnder device of the slab type having first and second parallel waveguide sections for transmission of an input signal, wherein said first waveguide section is covered with material having a first refractive index lower than the refractive index of said first waveguide section, and said second waveguide section is covered with material having a second refractive index different than said first refractive index and also lower than said refractive index of said second waveguide section, whereby a uniform electro-magnetic field applied to said parallel waveguide sections causes the propagation constants in said parallel waveguide sections to be varied in different ways, resulting in a phase difference between signals transmitted by said first and second waveguide sections.

4. An electro-optic high voltage sensor comprising a Mach-Zehnder device of the diffusion type having first and second parallel waveguide sections for transmission of an input signal, wherein said first and second waveguide sections are covered with thin films of material having large refractive indices relative to said waveguide sections, said thin films having sufficiently different thicknesses above each of said parallel waveguide sections so that a uniform electro-magnetic field applied to said parallel waveguide sections will cause the propagation constants in said parallel waveguide sections to be varied in different ways, resulting in a phase difference between signals transmitted by said first and second waveguide sections.

* * * * *